United States Patent [19]

Moraillon

[11] 4,455,533
[45] Jun. 19, 1984

[54] PROCESS FOR DEMODULATING A FREQUENCY-MODULATED SIGNAL AND DEMODULATORS USING THIS PROCESS

[75] Inventor: Jean Y. Moraillon, Paris, France

[73] Assignee: Thomson-CSF, Paris, France

[21] Appl. No.: 290,960

[22] Filed: Aug. 7, 1981

[30] Foreign Application Priority Data

Aug. 13, 1980 [FR] France .................. 80 17840

[51] Int. Cl.³ .............................................. H03D 3/00
[52] U.S. Cl. .................................... 329/126; 329/145; 455/214
[58] Field of Search ............... 329/110, 126, 145, 107; 455/337, 214; 375/80, 94

[56] References Cited

U.S. PATENT DOCUMENTS 3,670,251 6/1972 Shintani et al. .................... 375/94
3,956,623 5/1976 Clark et al. ........................ 328/133
4,090,145 5/1978 Webb ................................. 329/50

FOREIGN PATENT DOCUMENTS 29376 10/1980 France ........................... 329/110

Primary Examiner—Siegfried H. Grimm

[57] ABSTRACT

A demodulator is provided comprising: a sampler for sampling the signal to be demodulated at a rate equal to four times a frequency F' situated in the frequency band of the signal; a device for determining the position, in a reference frame Oxy, of the rotating vector associated with the signal to be demodulated, by calculating the arc tangent of a ratio $R = (y'(t)/x'(t))$ between a value $x'(t)$ of a signal sample and an average $y'(t)$ effected on the values $x'(t-1/4F')$ and $x'(t+1/4F')$ of the signal samples; and means for determining an estimation of the frequency variation between two times separated by $(1/F')$, by comparing the position of the rotating vector at these times.

4 Claims, 1 Drawing Figure

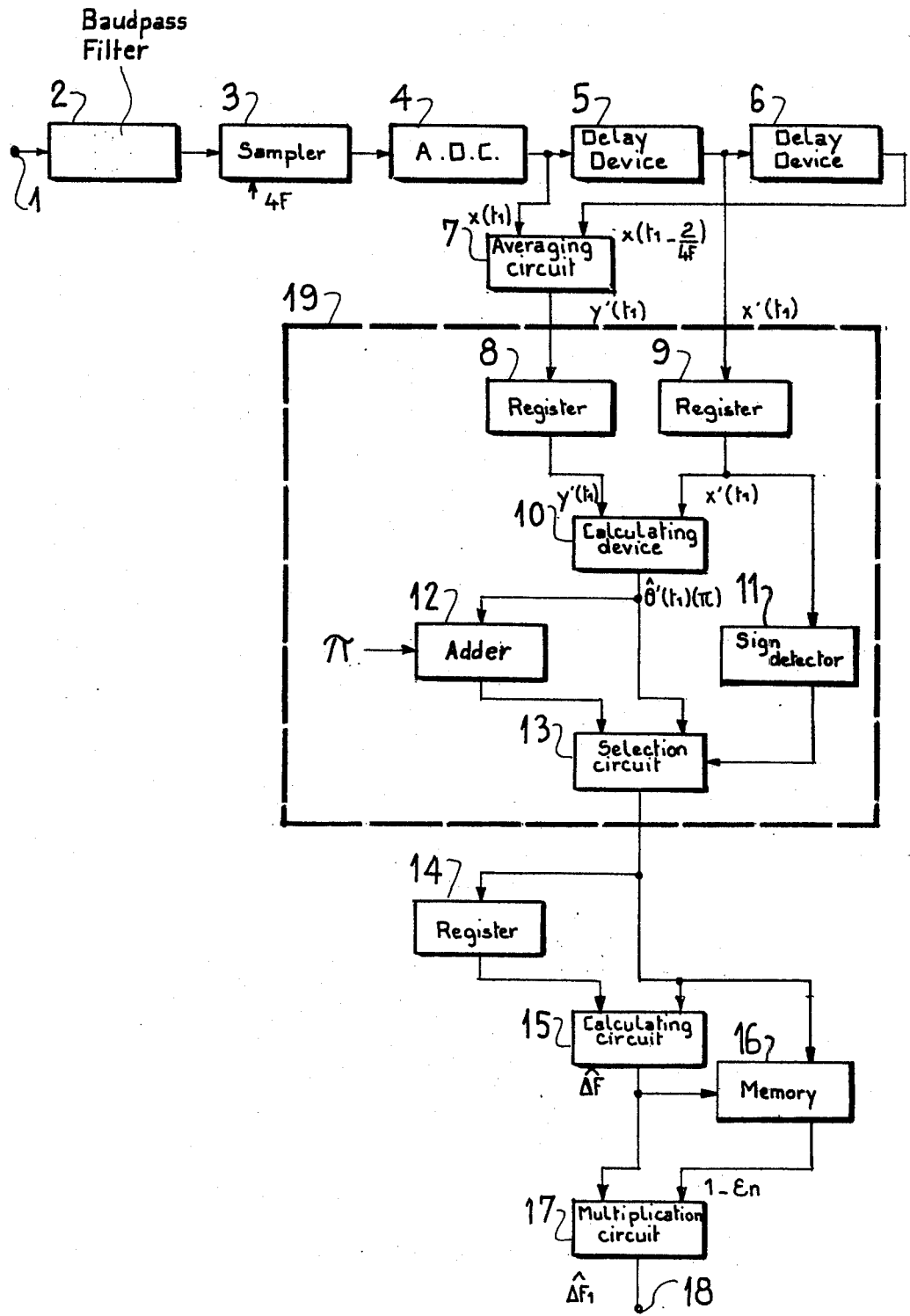

PROCESS FOR DEMODULATING A FREQUENCY-MODULATED SIGNAL AND DEMODULATORS USING THIS PROCESS

BACKGROUND OF THE INVENTION

The present invention relates to processes for demodulating frequency-modulated signals, demodulators using these processes and in particular SECAM television systems comprising such demodulators.

In the SECAM system, the color information modulates in frequency a subcarrier situated proximate the end of the highest frequencies and inside the luminance spectrum. This latter extends from 0 to about 6 MHz and the subcarrier, whose frequency deviation extends between 3.9 and 4.7 MHz is mixed with the principal spectrum. Different systems have been thought up for demodulating this subcarrier by means of conventional frequency discriminators which present the drawback of being sensitive to the amplitude variations of the signal to be processed.

There is described in U.S. patent application Ser. No. 205,503 a process for effecting digital demodulation of a frequency-modulated signal, more especially of a chrominance signal of a SECAM video signal, while presenting the advantage of not being sensitive to the amplitude variations of the low-frequency signal with respect to the central frequency.

This demodulation process consists, while considering the signal to be demodulated as being the projection on an axis Ox of a vector Z(t) rotating about a point 0 in an Oxy reference frame, in determining the variations of the frequency of the signal to be demodulated with respect to the variations of the rotational speed of the rotating vector, this determination being effected from the calculation of a linear combination ratio of samples of the value of the projection on the axis Ox of the rotating vector. In particular, one of the examples of the process described in U.S. patent application Ser. No. 205,503 consists in sampling the chrominance signal of a SECAM video signal at a rate equal to 4 times the central frequency F of the frequency band of the signal, then in determining the position of the rotating vector by means of two successive samples of the signal, and in determining a first value of the frequency variation between two times separated by (1/F) by comparing the position of the rotating vector at these times. The following formulae are established:

$$\hat{\theta}(t) = \arctan \frac{y(t)}{x(t)} \text{ with } \tan \hat{\theta}(t) = \frac{\sin\left[\theta(t) - \frac{\pi}{2} \frac{\delta F}{f}\right]}{\cos \theta(t)} \quad ①$$

$$\Delta\hat{\theta}(t') = \hat{\theta}\left(t + \frac{1}{F}\right) - \hat{\theta}(t) \text{ with } t' = t + \frac{1}{F} \quad ②$$

$$\Delta\hat{\theta}(t') = 2\pi \frac{\hat{\Delta F}}{F} \quad ③$$

$\delta F$ being the value of the frequency deviation, $\theta(t)$ being the angle of the vector Z(t) with the axis Ox of the Oxy reference frame; this angle allows the position of the vector Z(t) to be located, $x(t)$ being the projection of the vector Z(t) on the axis Ox; $x(t)$ corresponds therefore to the signal to be demodulated, $y(t)$ being the projection on the axis Ox of the "in quadrature" vector with respect to Z(t); $y(t)$ corresponds then to the projection on the axis Oy of the vector Z(t), $\hat{\theta}(t)$ being an estimation of the angle $\theta(t)$, $\Delta\hat{\theta}(t')$ being an estimation of the angular variation between two positions of the vector Z(t) at times spaced apart by 1/F and $\hat{\Delta F}$ being the value of the frequency variation between two times spaced apart by (1/F).

Since the relative band of the chrominance signal is small with respect to the central frequency F=4.3 MHz, it has been considered in the calculation of the formulae 1, 2 and 3 that the value $\delta F/F$ is very much less than 1.

The error committed with respect to $\hat{\Delta F}$ due to this approximation $(\delta F/F) \ll 1$ depends on the position of the vector and on the frequency to be demodulated.

In fact, according to formula 1:

$$\hat{\theta}(t) = \arctan\left[\frac{\sin\left[\theta(t) - \frac{\pi}{2} \frac{\delta F}{f}\right]}{\cos \theta(t)}\right] \quad ⑩$$

$$\hat{\theta}(t) = \arctan\left[\cos\left(\frac{\pi}{2} \frac{\delta F}{F}\right) \left[\tan \theta(t) - \tan\left(\frac{\pi}{2} \frac{\delta F}{F}\right)\right]\right].$$

It may be shown that the error committed with respect to the angle $\hat{\theta}(t)$ by application of the formula ⑩ is of the form:

$$\delta\hat{\theta}(t) = \frac{\epsilon^2}{4} \sin 2\theta(t) + \frac{\epsilon}{2} [1 + \cos 2\theta(t)]$$

$$\text{with } \epsilon = \frac{\pi}{2} \frac{\delta F}{F}.$$

The first term $(\epsilon^2/4) \sin 2\theta(t)$ due to the presence of the factor $$\cos\left(\frac{\pi}{2} \frac{\delta F}{F}\right)$$

in the expression of $\hat{\theta}(t)$ (formula ⑩ is negligible with respect to the term $$\frac{\epsilon}{2} [1 + \cos 2\theta(t)]$$

due to the presence of the term $$\tan\left(\frac{\pi}{2} \frac{\delta F}{F}\right).$$

It may furthermore be demonstrated that the resulting error committed with respect to $\hat{\Delta F}$ after a calculation of the form $$\hat{\Delta F} = \frac{F}{2\pi} [\hat{\theta}(t') - \hat{\theta}(t)]$$

(formulae ② and ③) is a function of the angle $\theta(t)$ by a term of the form $\sin 2\theta(t)$. The error changes sign therefore for angles in quadrature. This is why there is envisaged in U.S. patent application Ser. No. 205,503 a first method for minimizing the error consisting in taking the arithmetic average of two values of $\hat{\Delta}F$ obtained from two positions approximately in quadrature of the vector $Z(t)$.

The relative error $$\frac{\delta(^2\hat{\Delta}F)}{^2\hat{\Delta}F}$$

of the improved value $^2\hat{\Delta}F$ which results therefrom is modulated in amplitude by a sinusoidal function of the angle of the vector from which was calculated $\hat{\Delta}F$ about the value $\epsilon^2$. Thus, the relative error $$\frac{\delta(^2\hat{\Delta}F)}{^2\hat{\Delta}F}$$

is of the order of $\epsilon^2$ with $$\left|\frac{\delta(^2\hat{\Delta}F)}{^2\hat{\Delta}F}\right| \leq \epsilon^2.$$

As a complement to the first method of error minimization, there was also envisaged in U.S. patent application Ser. No. 205,503 a second method for improving the value $^2\hat{\Delta}F$. This additional method of error minimization consists in calculating the value of a correction factor $\epsilon_n$ as a function of $\hat{\Delta}F$ and $\hat{\theta}(t)$ and in deducing therefrom a final value $^3\hat{\Delta}F=(1-\epsilon_n)^2\hat{\Delta}F$ of the frequency variation.

The process of the present invention has the advantage of replacing the average effected, according to the first error minimization method, on the approximate values $\hat{\Delta}F$ of the frequency deviation after arc tangent calculation (formula ①), by an average effected with the arc tangent calculation directly on the values of the samples of the signal to be demodulated. This allows the time available for calculating the values $\hat{\theta}(t)$ to be multiplied by four, and so to make the practical execution of the system much easier.

The frequency for obtaining the calculated values $\hat{\Delta}F$ will then be F=4.3 MHz, of which the value is still considerably greater than the theoretical limit imposed by Shannon's theorem, considering the passband of the SECAM chrominance signals.

Futher, the relative error of the frequency deviation obtained by the process of the present invention is four times less than that of the frequency deviation $^2\hat{\Delta}F$ obtained by the process described in U.S. patent application Ser. No. 205,503.

BRIEF SUMMARY OF THE INVENTION

The present invention provides then a process for demodulating a frequency-modulated signal consisting in associating with the signal the projection on an axis Ox of a vector rotating about a point 0 in a reference frame Oxy; in sampling the signal at a frequency 4F' (F' being a frequency of the frequency band of the signal to be demodulated); in determining an approximate value of the position $\hat{\theta}(t)$ of the rotating vector by calculating the arc tangent $\theta'(t)$ of the ratio $R=(y'(t)/x'(t))$, between a value $x'(t)$ of a sample of the signal and an arithmetic average value $y'(t)$ of the values $x'(t+1/4F')$ and $x'(t-1/4F')$ corresponding respectively to the signal sample preceding $x'(t)$ and to the sample following $x'(t)$; in determining a first estimation $\hat{\Delta}F$ of the frequency variation between two sampling times $t_1$, $t_2$, separated by $1/F'$, by calculating $$\hat{\Delta}F = \frac{F'}{2\pi}[\hat{\theta}'(t_1) - \hat{\theta}'(t_2)].$$

BRIEF DESCRIPTION OF THE DRAWING

The present invention will be better understood and other features will appear from a calculation the principal steps of which will be given hereafter and from the following description and the single FIGURE which refers thereto in which is shown one embodiment of a demodulator using the calculating process.

DESCRIPTION OF THE PREFERRED EMBODIMENT

As in U.S. patent application Ser. No. 205,503, the frequency-modulated signal is represented by the projection $x(t)$ on the axis Ox of a reference frame Oxy of a rotating vector $Z(t)$.

The expression of $x(t)$ is the following:

$$x(t) = \cos[2\pi(F+\varepsilon F)t + \psi_0] = \cos[\theta(t)]$$

The expressions of the signals delayed by $(1/4F)$ and $(2/4F)$ are the following:

$$x\left(t - \frac{1}{4F}\right) = \cos\left[2\pi(F + \delta F)t - \frac{\pi}{2} - \frac{\pi}{2}\frac{\delta F}{F}\right] =$$

$$\sin\left[\theta(t) - \frac{\pi}{2}\frac{\delta F}{F}\right]$$

$$x\left(t - \frac{2}{4F}\right) = \cos\left[\theta(t) - \pi\frac{\delta F}{F}\right]$$

Thus $\theta'(t) = \theta(t) - \frac{\pi}{2}\frac{\delta F}{F}$, which gives:

$$x(t) = \cos\left[\theta'(t) + \frac{\pi}{2}\frac{\delta F}{F}\right]$$

$$x\left(t - \frac{1}{4F}\right) = \sin\theta'(t) = x'(t)$$

$$x\left(t - \frac{2}{4F}\right) = -\cos\left[\theta'(t) - \frac{\pi}{2}\frac{\delta F}{F}\right]$$

The average $y'(t)$ between $x(t)$ and $x(t-(2/4F))$ has for expression:

$$y'(t) = \frac{x(t) - x\left(t - \frac{2}{4F}\right)}{2} = \cos\theta'(t) \cdot \cos\frac{\pi}{2}\frac{\delta F}{F}.$$

Considering, as in U.S. patent application Ser. No. 205,503, that $(\delta F/F) \ll 1$, an estimation $\hat{\theta}'(t)$ of the angle $\theta(t)$ may be calculated by applying formula (1), from which:

$$\hat{\theta}'(t) = \arctan \frac{y'(t)}{x'(t)} = \arctan \left[ \frac{1}{\cos\left(\frac{\pi}{2} \cdot \frac{\delta F}{F}\right)} \cdot \tan\theta'(t) \right] \quad (11)$$

The value of the frequency deviation $\hat{\Delta}F$ follows from formulae (2) and (3) by replacing $\hat{\theta}(t)$ by $\hat{\theta}'(t)$, from which:

$$\hat{\Delta}F = \frac{F}{2\pi} \left[ \hat{\theta}'\left(t + \frac{1}{F}\right) - \hat{\theta}'(t) \right] \quad (12)$$

Comparing formula (11) with formula (10), it may be seen that the term $[\tan (\pi/2) \cdot \delta F/F]$ has disappeared. The result is that the error committed with respect to angle $\theta'(t)$ by the calculating process of the invention is $\delta\theta'(t) = (\epsilon^2/4) \sin 2\theta$ with $\epsilon = (\pi/2)\delta F/F$, and that the resulting relative error with respect to a frequency deviation $\hat{\Delta}F$ by formula (12) is $$\frac{\delta[\hat{\Delta}F]}{\hat{\Delta}F} = \frac{\epsilon^2}{2} \cdot \cos(2\theta + 4\epsilon) \quad (13)$$

This error is therefore twice as small as that of the previously-described process.

The accuracy may be further improved considering an error minimization method similar to the second method of U.S. patent application Ser. No. 205,503 which consists in calculating the value of a correction factor $\epsilon_n$ as a function of $\hat{\Delta}F$ and $\hat{\theta}(t)$ and in deducing therefrom a final improved value $\hat{\Delta}F_1 = (1 - \epsilon_n)\hat{\Delta}F$.

In the description relative to the single FIGURE the accurate synchronization devices, within the scope of current technology, have not been shown so as to make the drawing clearer and to simplify the description.

As can be seen from the single FIGURE the SECAM video signal to be demodulated is received at an input terminal 1 then is filtered by a bandpass filter 2 so as to select only the chrominance signal. This filter is a 3.9 MHz–4.7 MHz bandpass filter, which corresponds to the frequency spectrum of the chrominance signal. This chrominance signal is then sampled by a sampler 3 in accordance with a sampling frequency 4F, and converted into binary signals by an analog-to-digital converter 4.

A first delay device 5 delays the samples delivered by the analog-digital converter 4 by a time (1/4F). The output of this delay device is coupled to the input of a second delay device 6, providing a delay (1/4F), which delivers the samples supplied by the output of the analog-to-digital converter 4 with a delay (2/4F).

At a sampling time $t_1$, the two inputs of an averaging circuit 7 receive respectively the digital value of a sample $x(t_1)$ delivered by converter 4 and the digital value of a sample $x(t_1 - (2/4F))$ delivered by the second delay device 6. The averaging circuit 7 allows the average $$y'(t_1) = \frac{x(t_1) - x\left(t_1 - \frac{2}{4F}\right)}{2}$$

to be calculated.

The output of the averaging circuit 7 and the output of the first delay device 5 are connected respectively to the input of a first register 8 and to the input of a second register 9. These two registers 8 and 9, driven at frequency F, make available simultaneously $y'(t_1)$ and $x'(t_1)$ and provide storage thereof for a period of time (1/F) for carrying out the following calculations.

A calculating device 10 comprising two inputs coupled respectively to the output of register 8 and to the output of register 9 enables $\hat{\theta}'(t_1)$ to be calculated in accordance with formula (11) (with the exception of $\pi$).

An adder 12, one input of which is connected to the output of calculating device 10, supplies $\hat{\theta}'(t_1) + \pi$, i.e. arc tan $(y'(t_1)/x'(t_1)) + \pi$, to the first input of a selection circuit 13 whose second input is connected to the output of calculating device 10. This selection circuit delivers at its output either the value $\hat{\theta}'(t)$ supplied by the calculating device 10, or $\theta'(t) + \pi$ supplied by the adder 12. This selection is effected depending on the sign of $y'(t_1)$ and allows the true value of angle $\hat{\theta}'(t_1)$ to be reconstituted which is only known with the exception of $\pi$ at the output of calculating device 10. The detection of the sign of $y'(t_1)$ is made by means of a sign detector 11 whose input is connected to the output of register 9.

The assembly of elements formed by the two registers 8 and 9, the calculating device 10, the sign detector 11, the adder 12 and the selection circuit 13 form a device 19, for calculating the value of angle $\hat{\theta}'(t)$ associated with the position of the rotating vector, whose output is the output of the selection circuit 13. This output is connected to the input of a third register 14, which allows the value of angle $\hat{\theta}'(t_1)$ to be stored for a period (1/F), so as to be able to calculate on the appearance of a new value $\hat{\theta}'(t_1 + (1/F))$ the frequency deviation:

$$\hat{\Delta}F = \frac{F}{2\pi} \left[ \hat{\theta}'\left(t_1 + \frac{1}{F}\right) - \hat{\theta}'(t_1) \right] \quad \text{(formula 12)}$$

by means of a calculating circuit 15 whose first and second inputs are coupled respectively to the output of register 14 and to the output of the selection device 13. This latter output is also connected to the first addressing input of a memory 16 whose other addressing input is connected to the output of calculating circuit 15 and which supplies the value of the correction factor $1 - \epsilon_n$ calculated by formula (13), as a function of value $\hat{\theta}'(t)$ supplied by selection circuit 13 and value $\hat{\Delta}F$ supplied by calculating circuit 15. A multiplication circuit 17 whose first and second inputs are coupled respectively to the output of memory 16 and to the output of calculating circuit 15, delivers at an output terminal 18 the final value of the frequency deviation $\hat{\Delta}F_1 = (1 - \epsilon_n)\hat{\Delta}F$.

The invention is not limited to the embodiments described and shown, numerous variations are possible.

In particular, the functions effected by delay devices 5 and 6, the averaging circuit 7 and the calculating circuit 15, registers 8, 9 and 14, adder 12, sign detector 11, selection circuit 13, multiplication circuit 17, memory 16 and calculating device 10 may be formed by means of charge-transfer device (called DTC), the analog-digital converter 4 being then suppressed.

In the embodiment described it was chosen to sample the chrominance signal at a rate equal to 4 times the frequency F which is equal to 4.3 MHz. But this value is not restrictive, any frequency value F' in the frequency band of the chrominance signal is suitable.

Furthermore, it is possible to carry out a last operation on the digital values $\hat{\Delta}F_1$ obtained at the output of multiplication circuit 17 so as to obtain values which are not sensitive to the variations of frequency F. For that, all that is required, as described in U.S. patent application Ser. No. 205,503, is to select and store the values $\hat{\Delta}F_o$ associated with the reference burst accompanying the synchronizing signals and to correct the values $\hat{\Delta}F_1$ depending on these values.

Finally, it should be noted that the invention is applicable to the demodulation of any frequency-modulated signal, provided that the frequency band of the signal is small with respect to the central frequency.

What is claimed is:

1. A process for demodulating a frequency-modulated signal comprising: sampling the signal at a frequency 4F' (F' being a frequency of the frequency band of the signal to be demodulated); determining an approximate value $\hat{\theta}(t)$ by calculating the arc tangent $\theta'(t)$ of the ratio R=(y'(t)/x'(t)) between a value x'(t) of a sample of the signal and an arithmetic average value y'(t) of the values x'(t+(1/4F')) and x'(t−(1/4F')) corresponding respectively to the signal sample preceding x'(t) and to the sample following x'(t); determining a first estimation $\hat{\Delta}F$ of the frequency variation between two sampling times $t_1$, $t_2$, separated by (1/F'), by calculating $$\hat{\Delta}F = \frac{F}{2\pi}[\hat{\theta}'(t_1) - \hat{\theta}'(t_2)];$$

and producing a demodulated signal from the value $\hat{\Delta}F$.

2. The process as claimed in claim 1, wherein an error $\delta(\hat{\Delta}F)$, committed with respect to the value $\hat{\Delta}F$ of the first estimation of the frequency variation, is corrected by multiplying this value $\hat{\Delta}F$ by a correction factor $(1-\epsilon_n)$ where $$\epsilon_n \simeq \frac{\delta(\hat{\Delta}F)}{\hat{\Delta}F} \simeq \frac{\epsilon^2}{2} \cdot \cos(2\theta + 4\epsilon)$$

with $$\epsilon = \frac{\pi}{2} \cdot \frac{\delta F}{F}$$

and where $\delta F$ is the frequency deviation of the frequency-modulated signal about a central frequency F.

3. A demodulator for demodulating a frequency-modulated signal, the frequency band width of the modulated signal being small with respect to a central frequency F, comprising: a sampler sampling the modulated signal in accordance with a sampling frequency 4F', having one output; an analog-to-digital converter having one input coupled to the output of the sampler and one output, a first delay device providing a delay (1/4F'), having one input coupled to the output of the converter and an output delivering a value x'(t); a second delay device providing a delay (1/4F'), having one input coupled to the output of the first delay device and an output; an averaging circuit, for supplying the arithmetic average of the input signals, having a first and second input coupled respectively to the output of the converter and to the output of the second delay device and an output delivering a value y'(t), a calculating device for calculating a value $\hat{\theta}(t)=$arc tan (y'(t)/x'(t)), said calculating device having a first and a second input coupled respectively to the output of the averaging circuit and to the output of the first delay device and an output, a register for storing each value of angle $\hat{\theta}(t)$ for a period (1/F), and having one input coupled to the output of the calculating device and an output; a calculating circuit having a first and a second input coupled respectively to the output of the calculating device and to the output of the register and an output delivering the first estimation $\hat{\Delta}F$ of the frequency variation, in accordance with the following formula:

$$\hat{\Delta}F = \frac{F}{2\pi}\left[\hat{\theta}'\left(t + \frac{1}{F'}\right) - \hat{\theta}'(t)\right].$$

4. The demodulator as claimed in claim 3, comprising a memory, having a first addressing input and a second addressing input coupled respectively to the output of the calculating device and to the output of the calculating circuit, storing permanently and delivering the values of the correction factor $(1-\epsilon_n)$, a multiplication circuit having a first input coupled to the output of the calculating circuit, a second input coupled to the output of the memory and an output delivering a second estimation $\hat{\Delta}F_1=(1-\epsilon_n)\cdot\hat{\Delta}F$ of the frequency variation.

* * * * *